United States Patent
Kim et al.

(10) Patent No.: US 6,607,949 B2
(45) Date of Patent: Aug. 19, 2003

(54) METHOD FOR FABRICATING POLYSILICON THIN FILM TRANSISTOR WITH IMPROVED ELECTRICAL CHARACTERISTICS

(75) Inventors: Binn Kim, Seoul (KR); Hae Yeol Kim, Gyeonggi-do (KR); Dae Hyun Nam, Gyeonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/998,311

(22) Filed: Dec. 3, 2001

(65) Prior Publication Data

US 2002/0086469 A1 Jul. 4, 2002

(30) Foreign Application Priority Data

Dec. 29, 2000 (KR) ........................ P2000-85419

(51) Int. Cl.[7] ........................ H01L 21/00; H01L 21/84
(52) U.S. Cl. ........................ 438/166; 438/466; 438/486
(58) Field of Search .................... 438/166, 486, 438/487, 466, 470

(56) References Cited

U.S. PATENT DOCUMENTS

| | | | | |
|---|---|---|---|---|
| 5,897,347 A | * | 4/1999 | Yamazaki et al. | 438/166 |
| 5,963,823 A | * | 10/1999 | Yamazaki et al. | 438/479 |
| 5,970,369 A | * | 10/1999 | Hara et al. | 438/149 |
| 6,071,766 A | * | 6/2000 | Yamazaki et al. | 438/166 |
| 6,241,817 B1 | * | 6/2001 | Jang et al. | 117/3 |
| 6,309,951 B1 | * | 10/2001 | Jang et al. | 438/166 |
| 6,326,226 B1 | * | 12/2001 | Jang et al. | 438/486 |
| 6,329,269 B1 | * | 12/2001 | Hamada et al. | 438/486 |
| 6,331,457 B1 | * | 12/2001 | Yamazaki et al. | 257/610 |
| 6,342,409 B1 | * | 1/2002 | Seo | 438/161 |

* cited by examiner

*Primary Examiner*—John F. Niebling
*Assistant Examiner*—Angel Roman
(74) *Attorney, Agent, or Firm*—Morgan, Lewis & Bockius LLP

(57) ABSTRACT

A method for fabricating a thin film transistor includes forming a buffer layer on a substrate, forming a first amorphous silicon layer on the buffer layer, forming a plurality of metal clusters on the first amorphous silicon layer, forming a second amorphous silicon layer on the metal clusters including the first amorphous silicon layer, and simultaneously applying a heat-treatment and an electrical field to crystallize the first and the second amorphous silicon layers.

7 Claims, 4 Drawing Sheets

METHOD FOR FABRICATING POLYSILICON THIN FILM TRANSISTOR WITH IMPROVED ELECTRICAL CHARACTERISTICS

This application claims the benefit of Korean Application No. P2000-85419 filed on Dec. 29, 2000, which is hereby incorporated by reference.

BACKGROUND OF THE INVENTION

1. Field of the Invention

The present invention relates to a thin film transistor (TFT), and more particularly, to a method for fabricating a polysilicon TFT. Although the present invention is suitable for a wide scope of applications, it is particularly suitable for improving electrical characteristics of a polysilicon layer.

2. Discussion of the Related Art

In a conventional process for forming a polysilicon layer, an intrinsic amorphous silicon layer is formed on an insulating substrate by using a plasma chemical vapor deposition (PCVD) method or a low pressure chemical vapor deposition (LPCVD) method. When the amorphous silicon layer has a thickness of about 500 Å (angstrom), it is recrystallized into a polysilicon layer by a crystallization method. The crystallization method is generally classified into a laser annealing method, a solid phase crystallization (SPC) method, and a metal induced crystallization (MIC) method.

In the laser annealing method, an insulating substrate having an amorphous silicon layer thereon is heated to a temperature of about 250° C. (degrees celsius). Thereafter, an eximer laser beam is applied to the amorphous silicon layer to form a polysilicon layer. For the SPC method, a heat-treatment is applied to the amorphous silicon layer at a high temperature for a long time to form the polysilicon layer. For the MIC method, a metal layer is deposited on the amorphous silicon layer and the deposited metal layer is used as a crystallization seed. In case of the MIC method, a large sized glass substrate may be used as the insulating substrate.

The laser annealing method is a recently widely researched method in forming a polysilicon layer. In the laser annealing method, laser energy is provided for an amorphous silicon layer formed on the insulating substrate, thereby melting the amorphous silicon layer. Then, the melted amorphous silicon is cooled to form polysilicon.

In case of the SPC method, a buffer layer is formed on a quartz substrate that can stand at a temperature higher than 600° C. (degrees celsius). The buffer layer serves to prevent spreading a contamination that results from the quartz substrate. Thereafter, the amorphous silicon is deposited on the buffer layer and is sufficiently heated in a furnace at a high temperature so as to form the polysilicon layer. However, because the SPC method is performed at the high temperature, it is difficult to acquire a desired polysilicon phase.

In the process of the SPC method, because polysilicon grains are developed without a continuous directionability, the polysilicon layer formed by the SPC method may have an irregular surface. For a thin film transistor, a gate insulating layer covers the polysilicon layer. Therefore, if the polysilicon layer has the irregular surface, the gate insulating layer is also formed with an irregular surface, thereby decreasing a breakdown voltage of the thin film transistor. Further, since size of the polysilicon grains is very irregular, electrical characteristics of a device adopting the polysilicon layer may be deteriorated in the SPC method. Furthermore, the quartz substrate used for the SPC method is very expensive. Thus, fabrication cost can be increased.

Unlike the SPC method that uses the expensive quartz substrate, the MIC method uses a relatively inexpensive glass substrate to form polysilicon. In case of applying the MIC method, however, metal impurities may remain in the polysilicon network, thereby deteriorating the quality of the polysilicon layer. Accordingly, other methods have been developed to improve the MIC method.

A field effect metal induced crystallization (FEMIC) method is an example of the improved MIC method. In the FEMIC method, after metal is deposited on a substrate, a high density direct current is applied to the metal to cause Joule heating. Because of the heated metal, an amorphous silicon formed on the heated substrate is crystallized into polysilicon. In this process, the metal serves as a catalyzer and is referred to as a catalytic metal.

FIGS. 1A to 1F illustrate a process of forming a polysilicon TFT according to the related art. The polysilicon TFT in this illustration is a coplanar type TFT having a top gate structure, and the FEMIC method is used to form the TFT.

In FIG. 1A, a first insulating layer 2 (i.e. a buffer layer) and an amorphous silicon layer 4 are sequentially deposited on a substrate 1. The buffer layer 2 is to protect the amorphous silicon layer 4 from alkali substances, which may be produced from the substrate 1 during later processes. Generally the buffer layer 2 is formed of silicon oxide ($SiO_2$). After the amorphous silicon layer 4 is formed, thin catalytic metal clusters 8 are formed thereon. Nickel (Ni) is typically selected for the catalytic metal among a transition metal such as nickel (Ni), paladium (Pd), iron (Fe), and cobalt (Co). The catalytic metal 8 is deposited using sputter, evaporater or metal solution. As a high density direct current 10 is applied to the catalytic metal 8 for generating heat, the catalytic metal 8 acts as a catalyzer in crystallization of the amorphous silicon layer 4. In other words, silicide generated in the chemical reaction between the amorphous silicon layer 4 and the catalytic metal 8 acts as a seed of the crystallization.

In FIG. 1B, a power source 10 applies a high density direct current to the catalytic metal 8, thereby crystallizing the amorphous silicon layer 4 (shown in FIG. 1A) into a polysilicon layer 5. After the crystallization, the catalytic metal 8 is removed from the substrate 1, and the polysilicon layer 5 is patterned into a polysilicon island 12, as shown in FIG. 1C.

In FIG. 1D, a second insulating layer 14 referred to as a gate insulating layer and a gate electrode 16 are sequentially formed on the polysilicon island 12. Then, an ion doping is carried out injecting dopants into the polysilicon island 12 to form an active region 18, a source region 20, and a drain region 22 in the polysilicon island 12. The active region 18 is a pure silicon region, whereas the source and drain regions 20 and 22 are doped silicon regions. The active region 18 is disposed on the buffer layer between the source and drain regions 20 and 22, while the gate insulating layer 14 and the gate electrode 16 are positioned on the active region 18.

Because the gate insulating layer 14 and the gate electrode 16 are patterned with the same mask in order to reduce the number of masks, they have the same shape. When the ion doping is applied to the polysilicon island 12, the gate electrode 16 serves as an ion stopper to prevent the dopant from penetrating into the active region 18. After the ion doping is finished, the polysilicon island 12 implements a specific electric characteristic, which varies with types of the dopants. If the dopant is, for example, $B_2H_6$ that includes a Group III element, a doped portion of the polysilicon island 12 becomes a p-type semiconductor. Whereas, if the dopant is $PH_3$ that includes a Group VI element, the doped portion of the polysilicon island 12 becomes an n-type semiconductor. A proper dopant should be selected to satisfy the use of a device. After the dopant is applied onto the polysilicon island 12, the dopant is activated.

In FIG. 1E, a third insulating layer 24 that serves as an interlayer insulating layer is formed to cover the gate electrode 16, the active region 18, and the source and drain regions 20 and 22. A source contact hole 20a and a drain contact hole 22b are formed in the third insulating layer 24, thereby exposing the source and the drain region 20 and 22, respectively.

In FIG. 1F, a source electrode 26 and a drain electrode 28 are formed on the third insulating layer 24. The source and the drain electrode 26 and 28 electrically contact the source and the drain region 20 and 22, respectively, through the source and the drain contact hole 20a and 22a. Thereafter, a passivation layer 30 and a pixel electrode 34 are sequentially formed to cover the source and the drain electrode 26 and 28. The passivation layer 30 has a pixel contact hole 32 therein. Thus, a portion of the drain electrode 28 is exposed, and the pixel electrode 34 electrically contacts the drain electrode 28 through the pixel contact hole 32.

In the conventional process of fabricating the polysilicon TFT, a small amount of the catalytic metal is deposited on or below the amorphous silicon layer. Thereafter, a high density direct current is applied to form a crystallized silicon layer from an amorphous silicon layer. However, the method to deposit the catalytic metal on the surface of the amorphous silicon layer has a problem that the catalytic metal is oxidized in the air. Thus, the amount of the catalytic metal has to be increased to avoid the oxidation problem. Nonetheless, it invites another problem that a grain size of the silicon crystal becomes very small.

In addition, in the method to deposit the catalytic metal below the amorphous silicon layer, a part of the catalytic metal is oxidized when the insulating layer is oxidized. Moreover, it is difficult to form crystalline silicon with a good quality.

SUMMARY OF THE INVENTION

Accordingly, the present invention is directed to a method for fabricating a polysilicon TFT that substantially obviates one or more of problems due to limitations and disadvantages of the related art.

Another object of the present invention is to provide a method for fabricating a polysilicon TFT in which a catalytic metal is added in the middle of an amorphous silicon layer resulting in a polysilicon layer with good electrical characteristics.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of fabricating a polysilicon TFT includes forming a buffer layer on a substrate, forming a first amorphous silicon layer on the first insulating layer, forming a plurality of metal clusters on the first amorphous silicon layer, forming a second amorphous silicon layer on the metal clusters including the first amorphous silicon layer, and simultaneously applying a heat-treatment and a voltage to crystallize the first and the second amorphous silicon layers.

The catalytic metal is selected from a group consisting of nickel (Ni), paladium (Pd), iron (Fe), and cobalt (Co).

The method of fabricating a polysilicon TFT according to the present invention includes forming a buffer layer on a substrate, forming a first amorphous silicon layer on the buffer layer, forming a plurality of metal clusters on the first amorphous silicon layer, forming a second amorphous silicon layer on the metal clusters including the first amorphous silicon layer, simultaneously applying a heat-treatment and an electrical field to crystallize the first and the second amorphous silicon layers, thereby forming first and second polysilicon layers, patterning the first polysilicon layer to form a polysilicon island, and forming a gate electrode, a source electrode, and a drain electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE ILLUSTRATED EMBODIMENTS

Reference will now be made in detail to the illustrated embodiments of the present invention, examples of which are illustrated in the accompanying drawings. Wherever possible, the same reference numbers will be used throughout the drawings to refer to the same or like parts.

FIGS. 2A to 2F illustrate process steps of forming a polysilicon TFT according to the present invention.

Figure 1A:
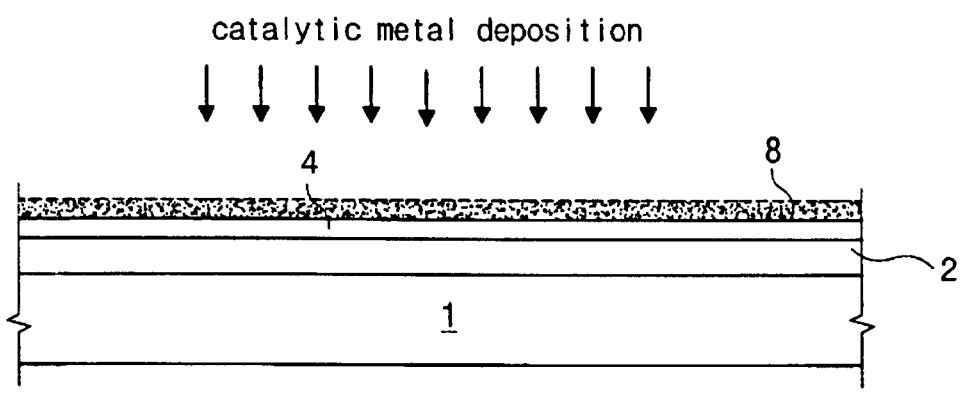
FIGS. 1A to 1F are cross-sectional views illustrating process steps of fabricating a polysilicon TFT according to the related art.
Figure 1B:
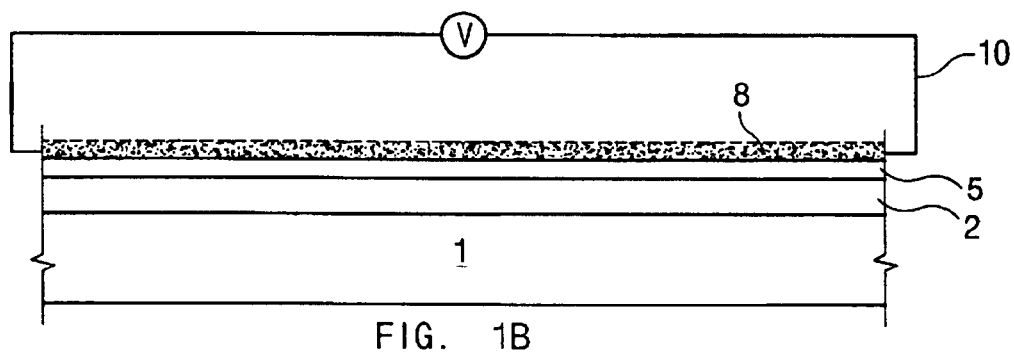
Figure 1C:
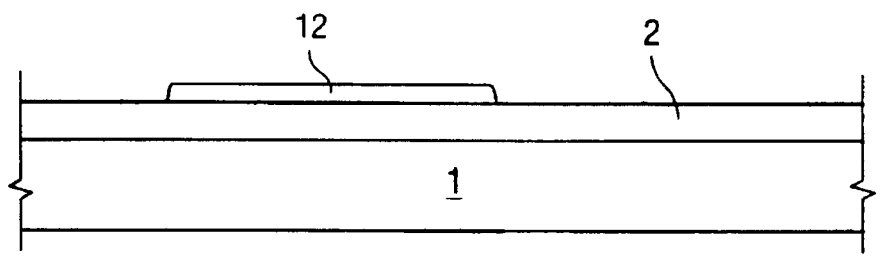
Figure 1D:
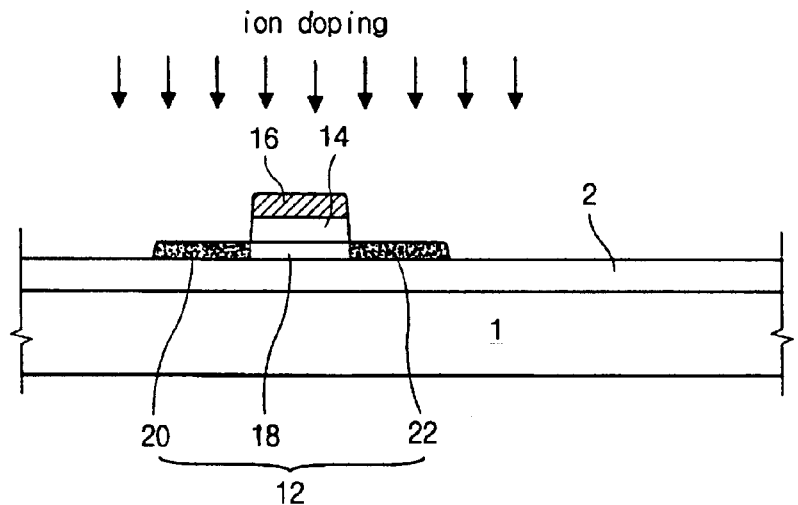
Figure 1E:
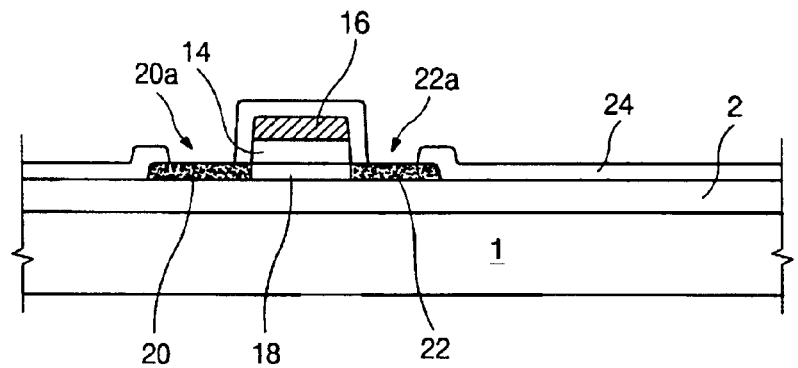
Figure 1F:
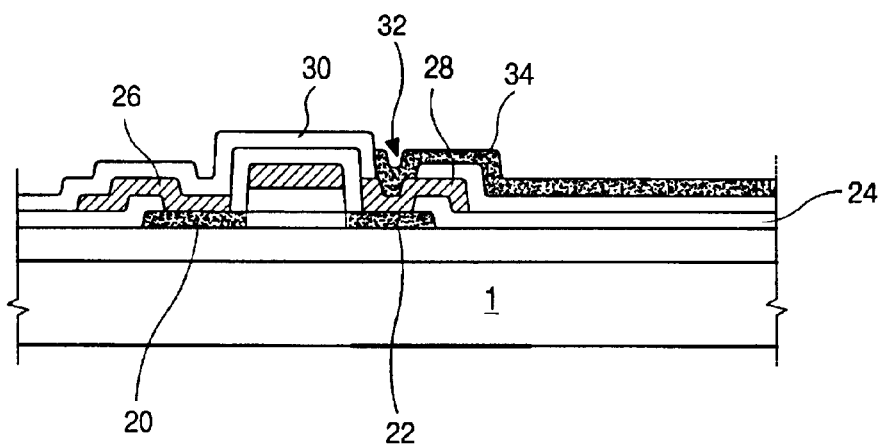
Figure 2A:
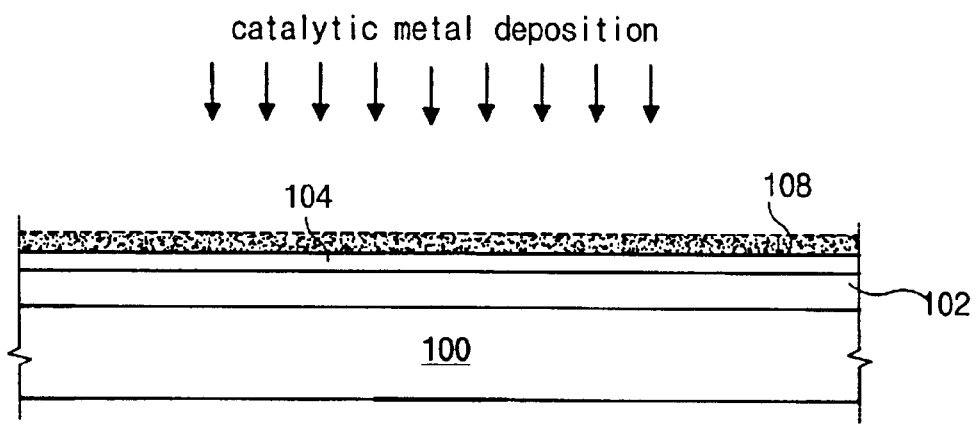
FIGS. 2A to 2F are cross-sectional views illustrating process steps of fabricating a polysilicon TFT according to the present invention.

In FIG. 2A, a first insulating layer 102 (i.e., a buffer layer) and a first amorphous silicon layer 104 are sequentially deposited on a substrate 100. The buffer layer 102 is to protect the amorphous silicon layer 104 from alkali substances, which may be produced from the substrate 100 during later processes. The first insulating layer 102 may be formed of silicon oxide ($SiO_2$). The first amorphous silicon layer 104 may be dehydrogenated by a heat-treatment. After the first amorphous silicon layer 104 is formed, a catalytic metal 108 is formed thereon. The catalytic metal 108 may include a transition metal selected from one of nickel (Ni), paladium (Pd), iron (Fe), and cobalt (Co). The metal clusters have a density of about $5 \times 10^{13}$ to $1 \times 10^{19}/cm^2$.

Figure 2B:
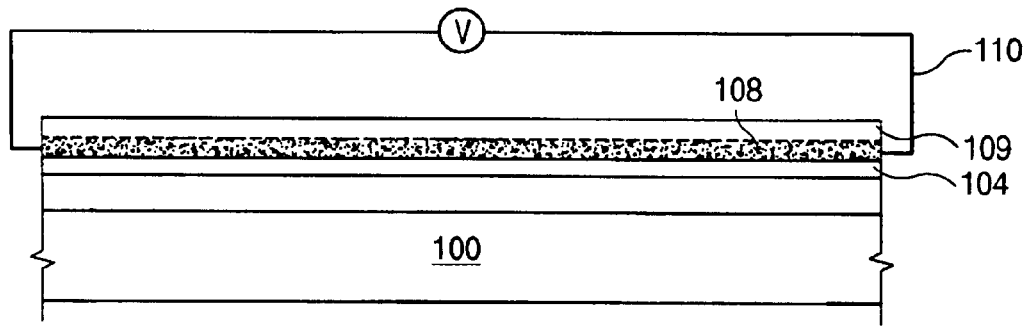

In FIG. 2B, a second amorphous silicon layer 109 is formed on the catalytic metal 108. To crystallize the first amorphous silicon layer 104 and the second amorphous silicon layer 109, a high density direct current through a power source 110 is applied to the catalytic metal 108 concurrently with a heat-treatment in the temperature range of about 400 to 600° C., thereby enhancing crystallization of the first amorphous silicon layer 104 and the second amorphous silicon layer 109 into a polysilicon layer. Either a DC or AC voltage may be applied. For example, the applied voltage may be in the range of about 10 to 500 V/cm. Since the catalytic metal 108 is not oxidized in this structure, less amount of the catalytic metal is required and a density of the catalytic metal attributing to the crystallization is maximized. Therefore, the catalytic metal and the amorphous silicon react with each other to form silicides which act as a crystallization seed. In addition, the density of grains becomes very low. As a result, a polysilicon layer is obtained having good electrical characteristics.

Figure 2C:
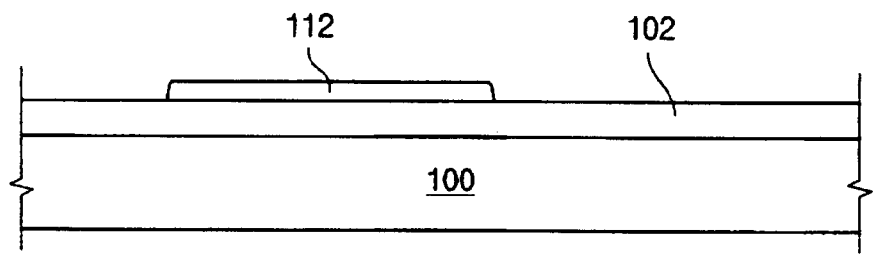

After the crystallization, the catalytic metal 108 may be removed from the substrate 100. Alternatively, the catalytic metal 108 may remain in the polysilicon layer. Thereafter, the polysilicon layer is then patterned into a polysilicon island 112, as shown in FIG. 2C.

Figure 2D:
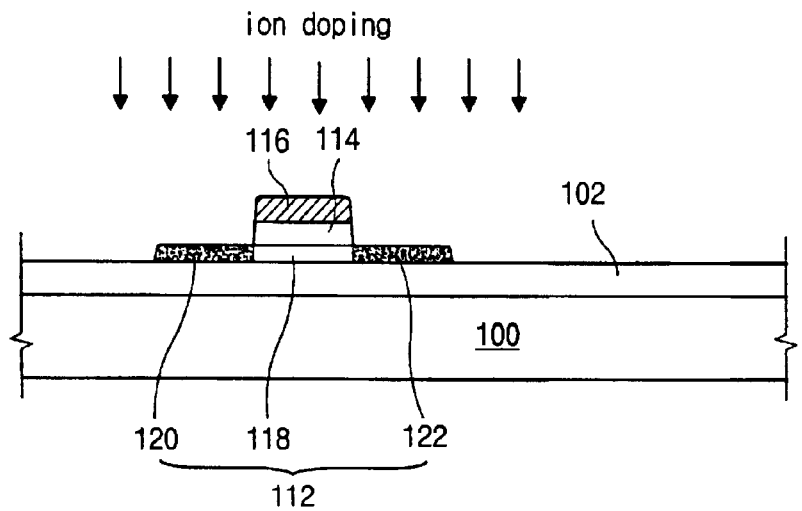

In FIG. 2D, a second insulating layer 114 referred to as a gate insulating layer and a gate electrode 116 are sequentially formed on the polysilicon island 112. Then, an ion doping injecting dopants is applied to the polysilicon island 112, thereby dividing the polysilicon island 112 into an active region 118, a source region 120, and a drain region 122. The active region 118 is a pure silicon region, whereas the source and the drain regions 120 and 122 are doped silicon regions. The active region 18 is disposed between the source and the drain region 120 and 122 on the buffer layer 102. The gate insulating layer 114 and the gate electrode 116 are disposed on the active region 118. The gate electrode may be formed of any conductive metal. For example, the conductive metal for the gate electrode 116 may be selected from a group consisting of aluminum (Al), aluminum alloy, tungsten (W), copper (Cu) and molybdenum (Mo).

Since the gate insulating layer 114 and the gate electrode 116 are patterned with the same mask in order to reduce the number of masks, they have the same shape. When the ion doping is applied to the polysilicon island 112, the gate electrode 116 serves as an ion stopper to prevent the dopant from penetrating into the active region 118. After the ion doping is finished, the polysilicon island 112 has desired electric characteristics, which varies with types of the dopant. For example, if the dopant is $B_2H_6$ that includes a Group III element, the doped portion of the polysilicon island 112 becomes a p-type semiconductor. On the contrary, if the dopant is $PH_3$ that includes a Group VI element, the doped portion of the polysilicon island 112 becomes an n-type semiconductor. A proper dopant should be selected to satisfy the use of a device. After the dopant is applied onto the polysilicon island 112, the dopant is activated.

Figure 2E:
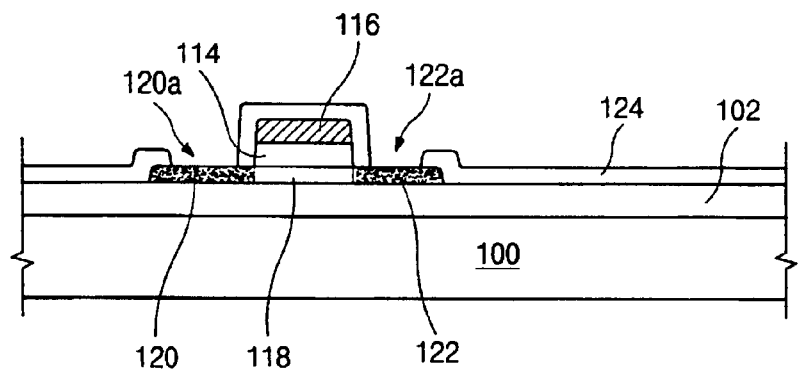

In FIG. 2E, a third insulating layer 124 that serves as an interlayer insulating layer is formed to cover the gate electrode 116, the active region 118, and the source and the drain region 120 and 122. A source contact hole 120a and a drain contact hole 122b are formed in the third insulating layer 124, thereby exposing the source and the drain region 120 and 122, respectively.

Figure 2F:
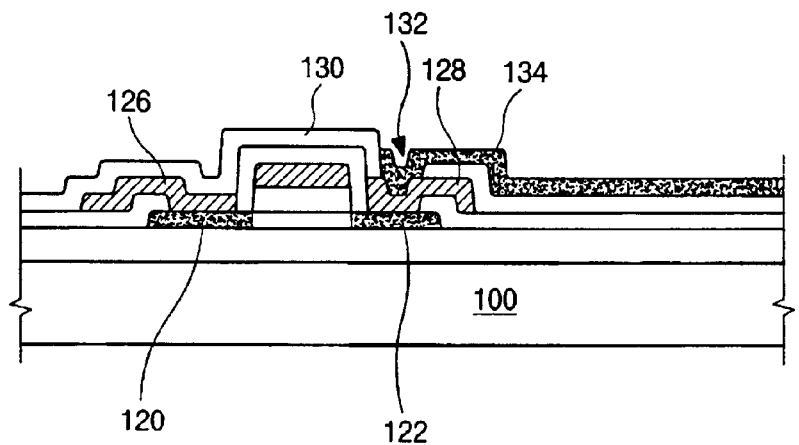

In FIG. 2F, a source electrode 126 and a drain electrode 128 are formed on the third insulating layer 124. The source and the drain electrode 126 and 128 electrically contact the source and the drain region 120 and 122, respectively, through the source and the drain contact hole 120a and 122a. Thereafter, a passivation layer 130 and a pixel electrode 134 are sequentially formed to cover the source and the drain electrode 126 and 128. The passivation layer 130 has a pixel contact hole 132 therein. Thus, a portion of the drain electrode 128 is exposed, and the pixel electrode 134 electrically contacts the drain electrode 128 through the pixel contact hole 132.

The above-described method for fabricating a polysilicon TFT is useful to apply in the process for fabricating a TFT LCD (liquid crystal display).

It will be apparent to those skilled in the art that various modifications and variations can be made in the method for fabricating a polysilicon thin film transistor of the present invention without departing from the spirit or scope of the inventions. Thus, it is intended that the present invention covers the modifications and variations of this invention provided they come within the scope of the appended claims and their equivalents.

What is claimed is:

1. A method for fabricating a thin film transistor, the method comprising:

forming a buffer layer on a substrate;

forming a first amorphous silicon layer on the buffer layer;

forming a plurality of metal clusters on the first amorphous silicon layer;

forming a second amorphous silicon layer on the metal clusters including the first amorphous silicon layer;

simultaneously applying a heat-treatment and an electrical field to crystallize the first and the second amorphous silicon layers, thereby forming first and second polysilicon layers;

patterning the first polysilicon layer to form a polysilicon island;

forming a gate electrode, a source electrode, and a drain electrode; and removing the second polysilicon layer and the metal clusters from the substrate.

2. The method of claim 1, wherein the metal clusters are selected from a group consisting of nickel (Ni), paladium (Pd), iron (Fe), and cobalt (Co).

3. The method of claim 1, wherein the buffer layer is formed of silicon oxide ($SiO_2$).

4. The method of claim 1, further comprising dehydrogenating the first amorphous silicon layer.

5. The method of claim 1, wherein the metal clusters have a density of about $5 \times 10^{13}$ to $1 \times 10^{19}/cm^2$.

6. The method of claim 1, wherein the applied heat treatment is in the range of about 400 to 600° C.

7. The method of claim 1, wherein the applied electrical field is in the range of about 10 to 500 V/cm.

* * * * *